US 6,940,742 B2

(12) United States Patent
Yamamura

(10) Patent No.: US 6,940,742 B2
(45) Date of Patent: Sep. 6, 2005

(54) METHOD OF STORING DATA IN FERROELECTRIC MEMORY DEVICE

(75) Inventor: Mitsuhiro Yamamura, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/816,854

(22) Filed: Apr. 5, 2004

(65) Prior Publication Data

US 2004/0257852 A1 Dec. 23, 2004

(30) Foreign Application Priority Data

Apr. 10, 2003 (JP) ........................................ 2003-106237

(51) Int. Cl.⁷ .......................... G11C 11/22; G11C 11/24
(52) U.S. Cl. ........................................ 365/145; 365/149
(58) Field of Search .................................. 365/145, 149

(56) References Cited

U.S. PATENT DOCUMENTS 5,615,145 A * 3/1997 Takeuchi et al. ............. 365/149
5,715,190 A * 2/1998 Honjo et al. ................. 365/149
6,795,330 B2 * 9/2004 Demange et al. ............ 365/145

FOREIGN PATENT DOCUMENTS

JP 09-116107 5/1997

OTHER PUBLICATIONS

U.S. Appl. No. 10/747,395, filed Dec. 30, 2003, Maruyama.
U.S. Appl. No. 10/747,523, filed Dec. 30, 2003, Maruyama.
U.S. Appl. No. 10/754,691, filed Jan. 12, 2004, Maruyama.
U.S. Appl. No. 10/737,959, filed Dec. 18, 2003, Maruyama.
U.S. Appl. No. 10/752,184, filed Jan. 7, 2004, Maruyama.
U.S. Appl. No. 10/758,179, filed Jan. 16, 2004, Maruyama.
U.S. Appl. No. 10/822,807, filed Apr. 13, 2004, Watanabe.

* cited by examiner

Primary Examiner—Trong Phan
(74) Attorney, Agent, or Firm—Oliff & Berridge, PLC

(57) ABSTRACT

A method of storing data in a ferroelectric memory device is capable of dealing with a program request during a read cycle or a change in program data during a program cycle. In this data storage method, the program cycle or the read cycle is performed for selected memory cells selected from among a plurality of memory cells, and each of the program cycle or the read cycle includes a period for writing data "0" and a period for writing data "1" into the selected memory cells. When a program request occurs in the period for writing the data "0" (read period) in the read cycle, the data "1" is written into the selected memory cells according to program data designated by the program request.

12 Claims, 14 Drawing Sheets

US 6,940,742 B2

METHOD OF STORING DATA IN FERROELECTRIC MEMORY DEVICE

Japanese Patent Application No. 2003-106237, filed on Apr. 10, 2003, is hereby incorporated by reference in its entirety.

BACKGROUND OF THE INVENTION

The present invention relates to a ferroelectric memory device. More particularly, the present invention relates to an improvement for processing the latest command when a write (program) and/or read command competes within a given period of time.

A cross-point type ferroelectric memory device in which only one ferroelectric capacitor is disposed in one memory cell has a program cycle and a read cycle of the same type as other memory devices such as an SRAM or DRAM.

In the SRAM or DRAM, new program data can be written in the middle of writing the program data. In the case where a program request occurs in the middle of the read cycle, the read cycle can be immediately changed to the program cycle.

The cross-point type ferroelectric memory device stores data by using hysteresis characteristics of the ferroelectric capacitor, differing from the SRAM or DRAM. Therefore, each of the program cycle and the read cycle includes a data "0" write period and data "1" write period, and substantially includes two steps (details are described later). Therefore, the cross-point type ferroelectric memory device may be synchronous in which a request or a change in program data is not accepted after the address of the selected memory cell has been designated and the program cycle or the read cycle has started.

In the synchronous ferroelectric memory device, a change to the program cycle is not accepted in the middle of the read cycle, and a change in program data is not accepted in the middle of the program cycle.

However, if only the cross-point type ferroelectric memory device is synchronous, the specification completely differs from that of the SRAM or DRAM. This causes inconvenience to the user.

BRIEF SUMMARY OF THE INVENTION

In view of the special characteristics of the program cycle and the read cycle of the cross-point type ferroelectric memory device, the present invention may provide a method of storing data in a ferroelectric memory device which enables data storage based on the latest program request or program data even if the request or program data for the selected memory cell is changed.

One aspect of the present invention relates to a method of storing data in a ferroelectric memory device which includes a plurality of wordlines, a plurality of bitlines which intersect the plurality of wordlines, and a plurality of memory cells, each of the memory cells being provided at an intersecting point of one of the wordlines and one of the bitlines and including a ferroelectric capacitor to which voltage between one of the wordlines and one of the bitlines that intersect each other is directly applied, the method including:

performing a program cycle or a read cycle for a plurality of selected memory cells selected from among the plurality of memory cells, each of the program cycle and the read cycle including a first period for writing first data into the selected memory cells and a second period for writing second data into the selected memory cells, and the second period being set after the first period; and writing the second data into the selected memory cells according to program data designated by the program request, when a program request occurs in the first period in the read cycle.

If the first data is data "0", the second data is data "1". The read cycle includes two steps consisting of a read step as the first step and a rewrite step as the latter step. In the read step, the first data is written into all of the selected memory cells, whereby data is read from the selected memory cells. In the rewrite step, the second data is written into the selected memory cell that stores the second data before the read step. The program request can be accepted in the read cycle if it is before the rewrite step substantially starts. This is because a period for the rewrite step can be changed to the second period in the program cycle if the program request is accepted before the rewrite step substantially starts. In this case, the first data is written into the selected memory cell that is to store the second, data according to the program data designated by the program request accepted instead of performing the rewrite step.

Since the read period substitutes for the first period in the program cycle, it is unnecessary to perform a write operation of the first data. This is because the first data is written into all of the selected memory cells in the read period in the read cycle in the same manner as in the first period in the program cycle.

When the program request occurs in the second period in the read cycle, the second data may be rewritten into a memory cell that stores the second data among the selected memory cells without accepting the program request.

The program data may be input before the second period starts. It should be noted that the program data may be input before the wordlines or the bitlines connected with the selected memory cells reach a select voltage in the second period. This is because the second data is not written until the wordline or the bitline rises to the select voltage.

The second period may start after the program data has been input without limiting the input period of the program data.

In this case, the memory cells may be set in a standby state, in which the voltage is not applied to the memory cells, during a period until the program data is input after the first period has finished. This aims at preventing deterioration of data caused by a disturbance voltage applied to the memory cells while waiting for data input.

With this aspect, the program request may be accepted in the second period in the read cycle. In this case, the read cycle may be terminated before an entire part of the read cycle has completed and the program cycle starts according to the program request. This is because the first data written into all of the selected memory cells in the first period (read period) in the read cycle is not held if the second period in the read cycle has started.

Another aspect of the present invention relates to a method of storing data in a ferroelectric memory device having the above-described configuration, the method including:

performing a program cycle or a read cycle for a plurality of selected memory cells selected from among the plurality of memory cells, each of the program cycle and the read cycle including a first period for writing first data into the selected memory cells and a second period for writing second data into the selected memory cells, and the second period being set after the first period; and writing the first data into all of the memory cells irrespective of presence or absence of program data in the first period in the program cycle, and writing the second data into a memory cell designated by the program data from among the plurality of selected memory cells when the program data is input in the first period in the program cycle.

If the first data is data "0", the second data is data "1". The program cycle started according to the program request includes two steps consisting of a write "0" step as the first step and a write "1" step as the latter step. In the write "0" step, the first data (data "0") is written into all of the selected memory cells in the same manner as in the read step in the read cycle. In the write "1" step, data "1" is written into the selected memory cell that is to store data "1", according to the program data.

The program data can be accepted in the program cycle if it is before the second period substantially starts. This is because the program data is unnecessary in the first period since the first data is written into all of the selected memory cells. If the program data exists before the second period substantially starts, the second data can be written according to the program data.

Even if the program data is changed in the first period, it is unnecessary to repeatedly perform a write operation of the first data in the program cycle. This is because the first data is written into all of the selected memory cells in the first period irrespective of the content of the program data.

With this aspect, when a change request for new program data occurs in a period other than the first period, the change request may not be accepted. This is because the second period cannot be started at predetermined timing if the change request is accepted. When the program data is input or the change request for new program data occurs before the wordlines or the bitlines connected with the selected memory cells reach a select voltage in the second period, the write operation of the second data may be performed according to the latest program data. This is because the write operation of the second data is performed after the wordlines or the bitlines connected with the selected memory cells have reached the select voltage in the second period.

Alternately, the second period in the program cycle may start after the program data has been input. In this case, the memory cells are preferably set in a standby state in which the voltage is not applied to the memory cells until the program data is input after the first period has finished. This aims at preventing deterioration of data when waiting for input of the program data as described above.

DETAILED DESCRIPTION OF THE EMBODIMENT

An embodiment of the present invention is described below with reference to the drawings.

1. Ferroelectric Memory Cell

Figure 1:
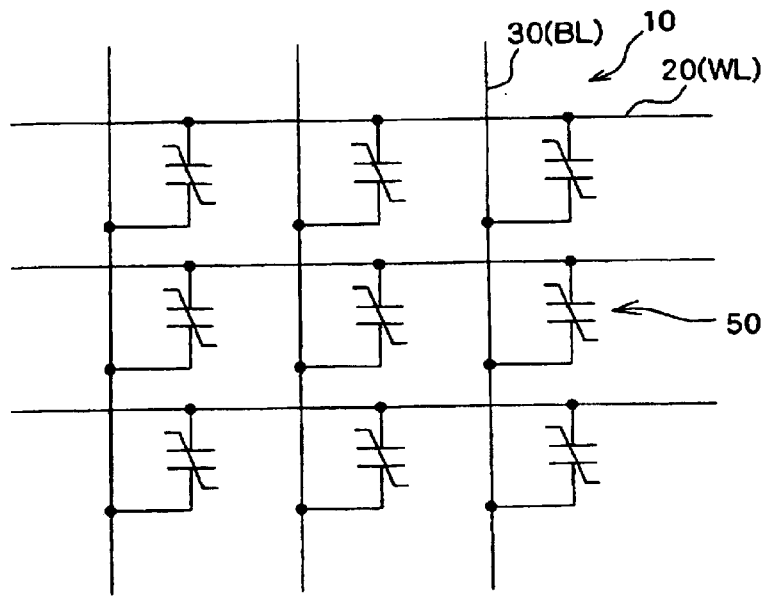
FIG. 1 is a schematic diagram of a ferroelectric memory cell array according to an embodiment of the present invention.

FIG. 1 is a schematic explanatory diagram of a memory cell array of a ferroelectric memory device according to this embodiment. FIG. 1 shows a memory cell array 10 of a cross-point type ferroelectric memory device. The memory cell array 10 includes a plurality of wordlines 20 (WL) extending along a first direction such as a row direction, and a plurality of bitlines 30 (BL) extending along a second direction such as a column direction which intersects the first direction. At least either the wordline 20 or the bitline 30 may be stratified, and a main-wordline and a sub-wordline or a main-bitline and a sub-bitline may be provided.

A ferroelectric capacitor 50, to which the voltage between the wordline 20 and the bitline 30 is directly applied, is formed at each intersecting point of the wordlines 20 and the bitlines 30. One ferroelectric capacitor 50 forms a 1-bit memory cell.

2. Description of General Operation

This ferroelectric memory device is a memory device which utilizes two polarization states which appear in the hysteresis curve of the ferroelectric capacitor 50 as one bit.

Figure 2:
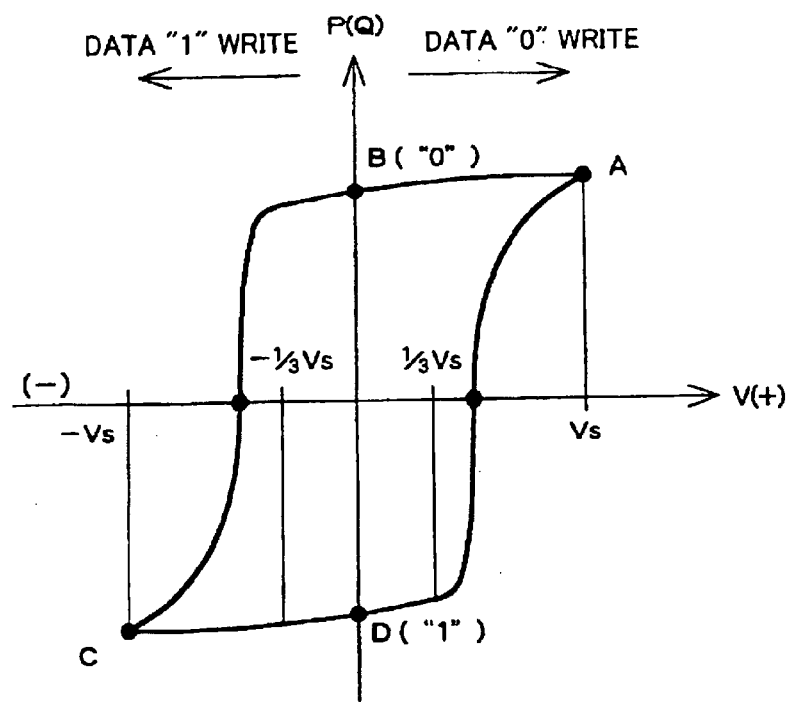
FIG. 2 shows hysteresis curve of applied-voltage and polarization of a ferroelectric capacitor.

The hysteresis curve is described below. FIG. 2 shows the correlation between the voltage applied to the ferroelectric capacitor 50 and the polarization of the ferroelectric. The vertical axis P in FIG. 2 indicates the polarization of the ferroelectric capacitor 50, and the horizontal axis V indicates the voltage applied to the ferroelectric capacitor 50. The curve in FIG. 2 shows characteristics in which the polarization state of the ferroelectric capacitor 50 cycles corresponding to the change in the voltage applied to the ferroelectric capacitor 50. When a select voltage Vs is applied to the ferroelectric capacitor 50 in a state at a point B (memory state of logical value "0") or in a state at a point D (memory state of logical value "1"), the polarization state transitions to a point A (reading of logical value "0" or "1"). When the applied voltage is changed to 0 V, the polarization state transitions to the point B. Specifically, the polarization state which is originally at the point D also transitions to the point B through the point A. When the select voltage −Vs is applied to the ferroelectric capacitor 50, the polarization state transitions to a point C (writing of logical value "1"). When the applied voltage is then changed to 0 V, the polarization state transitions to the point D (memory state of logical value "1").

An unselected voltage ±Vs/3 used in a ⅓ bias method is applied to the ferroelectric capacitor 50 in the polarization state at the point B or D, for example. When the applied voltage is then changed to 0 V, the polarization state returns to the original point B or D. This shows that the memory state is maintained even if the unselected voltage ±Vs/3 is applied to the unselected ferroelectric capacitor 50 when one ferroelectric capacitor 50 is selected.

As described with reference to FIG. 2, the positive and negative polarization directions of the ferroelectric capacitor 50 may be respectively considered as 1-bit logical values "0" and "1". In the present specification, the polarization at the point B in FIG. 2 is considered as the logical value "0", and the polarization at the point D in FIG. 2 is considered as the logical value "1". However, the definition may be the reverse of the above definition. The voltage Vs is applied to the ferroelectric capacitor 50 when storing the logical value "0" (data "0" write operation), and the voltage −Vs is applied to the ferroelectric capacitor 50 when storing the logical value "1" (data "1" write operation).

The data program (write) cycle and the data read cycle of the ferroelectric memory device are described below with reference to FIGS. 3 to 6.

Figure 3:
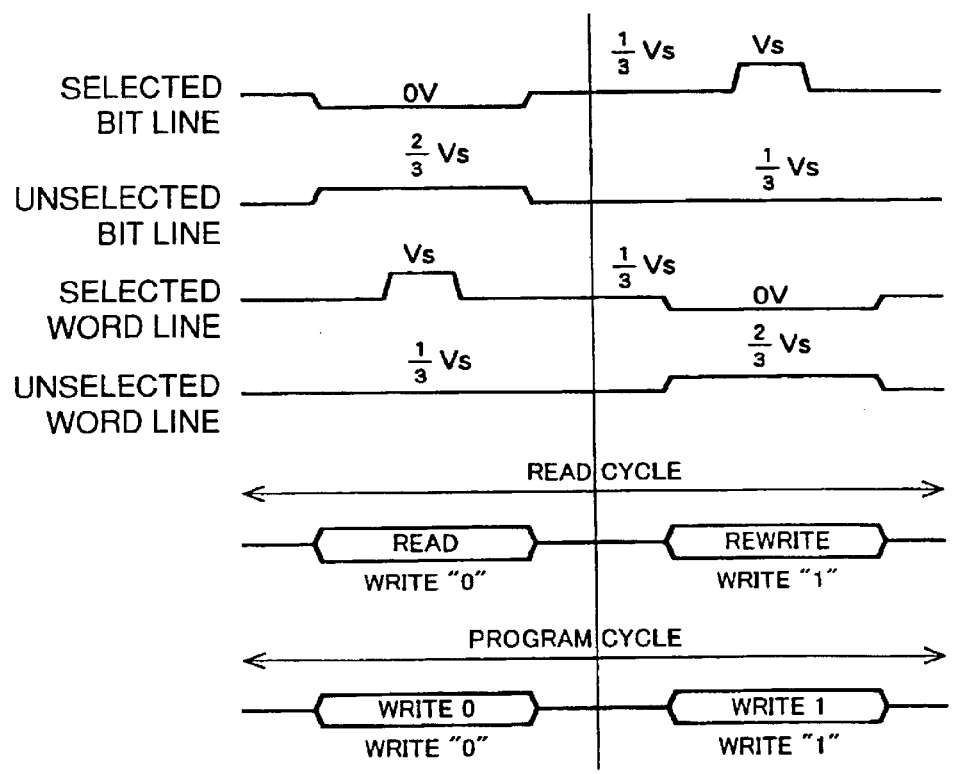
FIG. 3 illustrates that each of a program cycle and a read cycle includes a data "0" write period and a data "1" write period.

As shown in FIG. 3, the program cycle requires the data "0" write operation (write "0") and the data "1" write operation (write "1"). Since the voltage application direction must be reversed between the data "0" write period and the data "1" write period from the viewpoint of characteristics of the ferroelectric capacitor 50, the step of writing data "0" and the step of writing data "1" are necessary.

Figure 4:
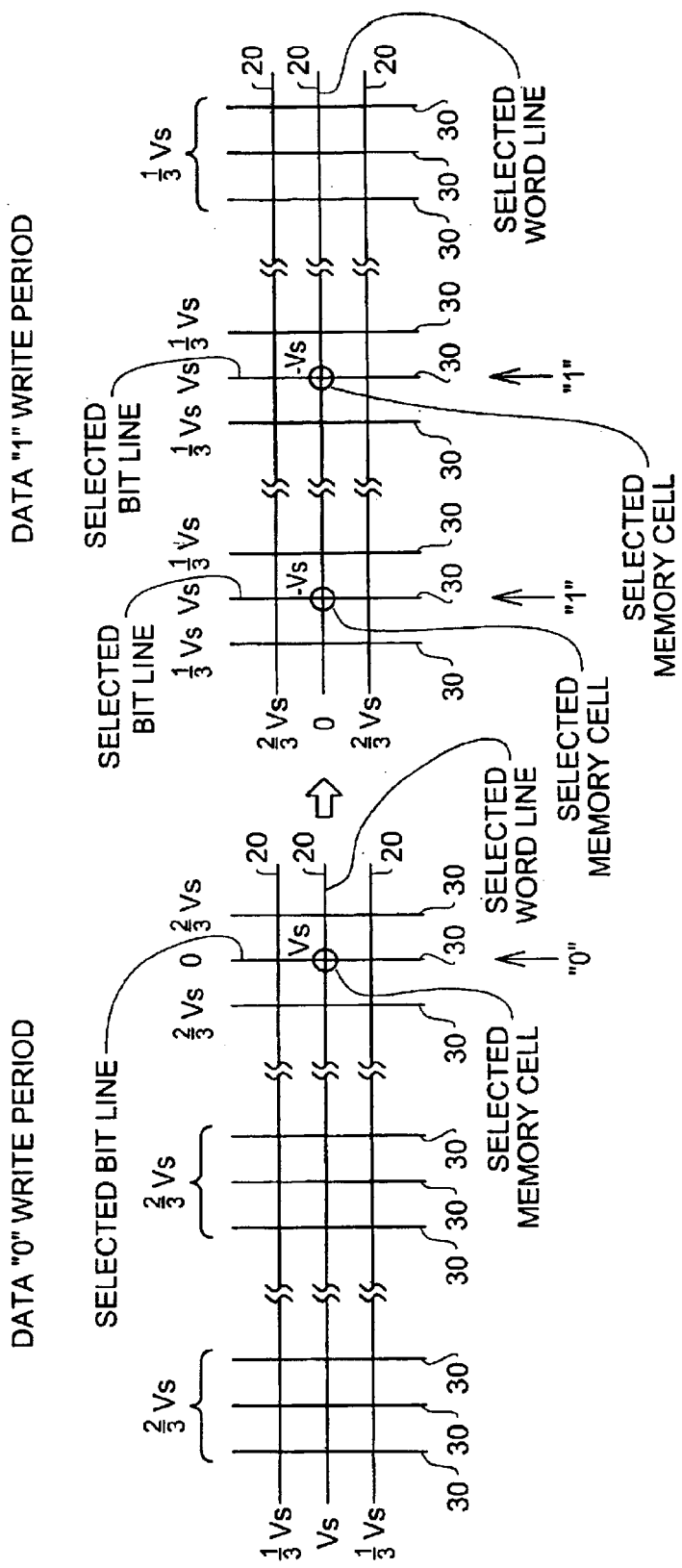
FIG. 4 shows an applied voltage in a data "0" write period and a data "1" write period in a program cycle.

As shown in FIGS. 3 and 4, in the data "0" write period in the first half of the program cycle, 0 V is applied to the selected bitline connected with the ferroelectric capacitor in which data "0" should be written (selected memory cell), and Vs (power supply voltage Vcc, for example) is applied to the selected wordline. The polarization state is moved from the point B or D to the point A in FIG. 2 by applying +Vs to the selected memory cell, whereby data "0" is written into the selected memory cell. ⅔ Vs is applied to the unselected bitlines connected with the unselected memory cells, and ⅓ Vs is applied to the unselected wordlines. Therefore, ±⅓ Vs is applied to the unselected memory cells, whereby the memory state is maintained.

In the data "1" write period in the latter half of the program cycle, Vs (power supply voltage Vcc, for example) is applied to the selected bitline connected with the ferroelectric capacitor in which data "1" should be written (selected memory cell), and 0 V is applied to the selected wordline. The polarization state is moved from the point B or D to the point C in FIG. 2 by applying −Vs to the selected memory cell in this manner, whereby data "1" is written into the selected memory cell. ⅓ Vs is applied to the unselected bitlines connected with the unselected memory cells, and ⅔ Vs is applied to the unselected wordlines. Therefore, ±⅓ Vs is applied to the unselected memory cells, whereby the memory state is maintained.

Figure 5:
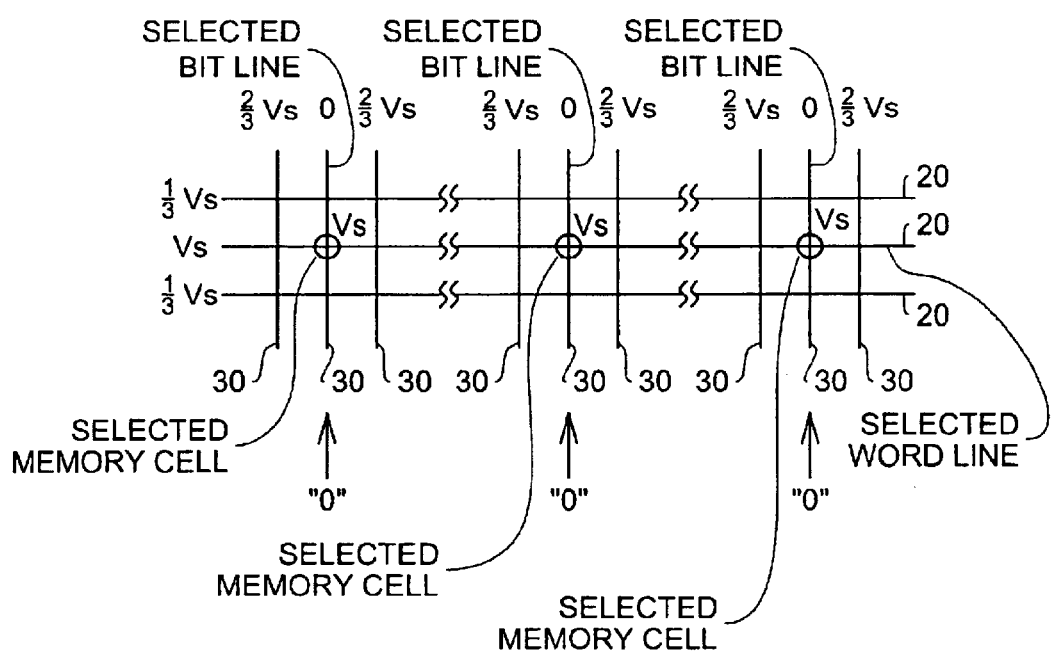
FIG. 5 shows an applied voltage in a data "0" write period used instead of the first period in FIG. 4 in this embodiment of the present invention.
Figure 6:
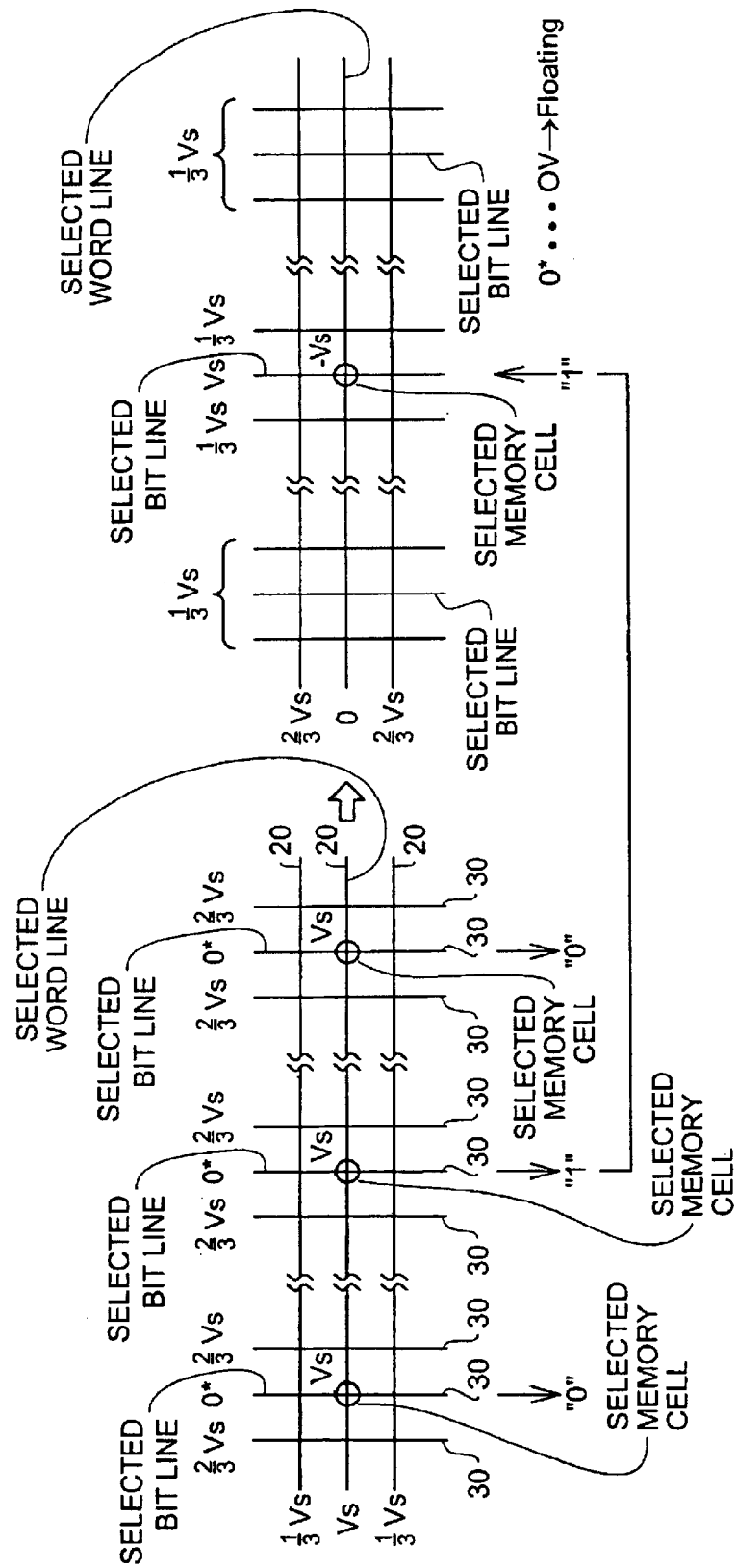
FIG. 6 shows an applied voltage in a data "0" write period and a data "1" write period in a read cycle.

In this embodiment, an operation in the data "0" write period shown in FIG. 5 is employed instead of the operation in the data "0" write period shown in FIG. 4. In FIG. 5, data "0" is written into all of the selected memory cells. The data "1" write period after the data "0" write period is the same as the operation in the latter period in FIG. 4. Data "0" is stored in the selected memory cell in which data "0" is written in the data "0" write period in FIG. 5 and in which data "1" is not written in the latter period in FIG. 4. Therefore, if only the first period in FIG. 4 is changed to the data "0" write period in FIG. 5, the memory state of all of the selected memory cells is the same as the memory state in the case where both the first period and the latter period in FIG. 4 are performed.

The address information of the selected memory cell in which data "1" should be stored is unnecessary during the data "0" write period by employing the operation in the data "0" write period in FIG. 5. This means that the address information of the selected memory cell in which data "1" should be stored can be changed during the data "0" write period in the program cycle. This is the premise by which an asynchronous ferroelectric memory device is realized.

Since this ferroelectric memory device is a destructive read type, a rewrite operation is necessary after the read operation. Therefore, the read cycle requires two steps consisting of the read step and the rewrite step, as shown in FIG. 3. In the read step in the first half of the read cycle in FIGS. 3 and 6, the voltage Vs is applied in the same application direction as in the data "0" write operation. This causes the polarization of the ferroelectric capacitor to move from the point B or D to the point A in FIG. 2, whereby the state retained in the selected memory cell is read based on the amount of charge in the ferroelectric capacitor 50. In the rewrite step in the latter half of the read cycle, data "1" is rewritten into only the cell which has originally stored data "1" by applying the select voltage −Vs.

As described above, the data "0" write operation and the data "1" write operation are performed in each of the read cycle and the program cycle.

3. Ferroelectric Memory Device

Figure 7:
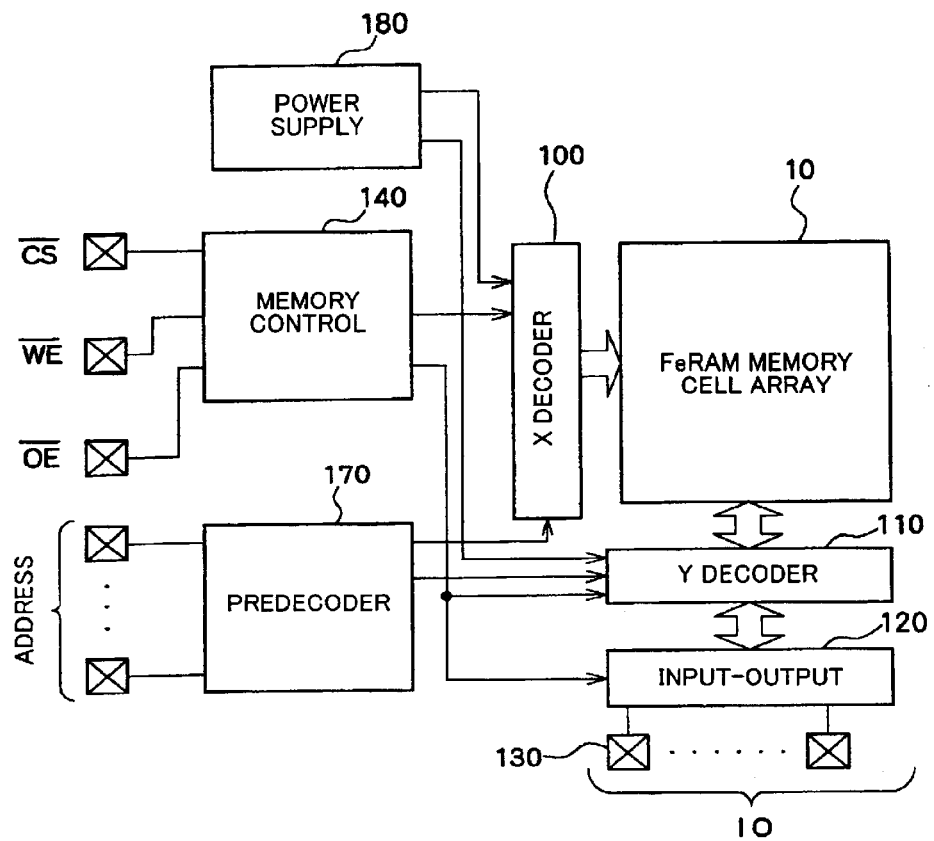
FIG. 7 is a block diagram showing an example of a ferroelectric memory device to which a data storage method of the present invention is applied.

FIG. 7 shows a ferroelectric memory device including the ferroelectric memory cell array 10 shown in FIG. 1. In FIG. 7, an X (first) decoder 100 and a Y (second) decoder 110 for driving the ferroelectric memory cell array 10 are provided. The X decoder 100 drives the wordlines 20 shown in FIG. 1, and the Y decoder 110 drives the bitlines 30 shown in FIG. 1. Data read from or written into the ferroelectric memory cell array 10 through the Y decoder 110 is input or output through an input-output circuit 120 and I/O terminals 130.

Figure 8:
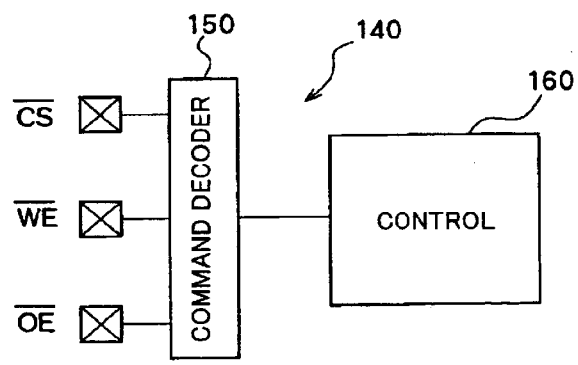
FIG. 8 is a block diagram of a memory control circuit shown in FIG. 7.

In FIG. 7, a chip select signal /CS, a write enable signal /WE, and an output enable signal /OE are illustrated as command signals. The program cycle or the read cycle is performed on condition that the chip select signal /CS is active. The write enable signal /WE is enabled for a program request, and disabled for a read request. If the output enable signal /OE is active, data read from the memory cell in the read cycle is output to the outside. A chip enable signal /CE may be used instead of the chip select signal /CS. As shown in FIG. 8, the command signals are decoded by using a command decoder 150 in a memory control section 140, and the content of the request is output to a control circuit 160 from the command decoder 150.

A predecoder 170 shown in FIG. 7 predecodes an address signal. The predecoded information is used to select or unselect the wordline and the bitline in the X and Y decoders 100 and 110.

A power supply circuit 180 shown in FIG. 7 generates various voltages described with reference to FIGS. 3 to 6 (Vs, ⅔ Vs, ⅓ Vs, and 0, for example), and supplies the voltages to the X and Y decoders 100 and 110.

The memory control operation of the control circuit 160 shown in FIG. 8 is described below. In this embodiment, the control circuit 160 is programmed in advance so that one of the following control operations is performed.

4. First Data Storage Method

Figure 9:
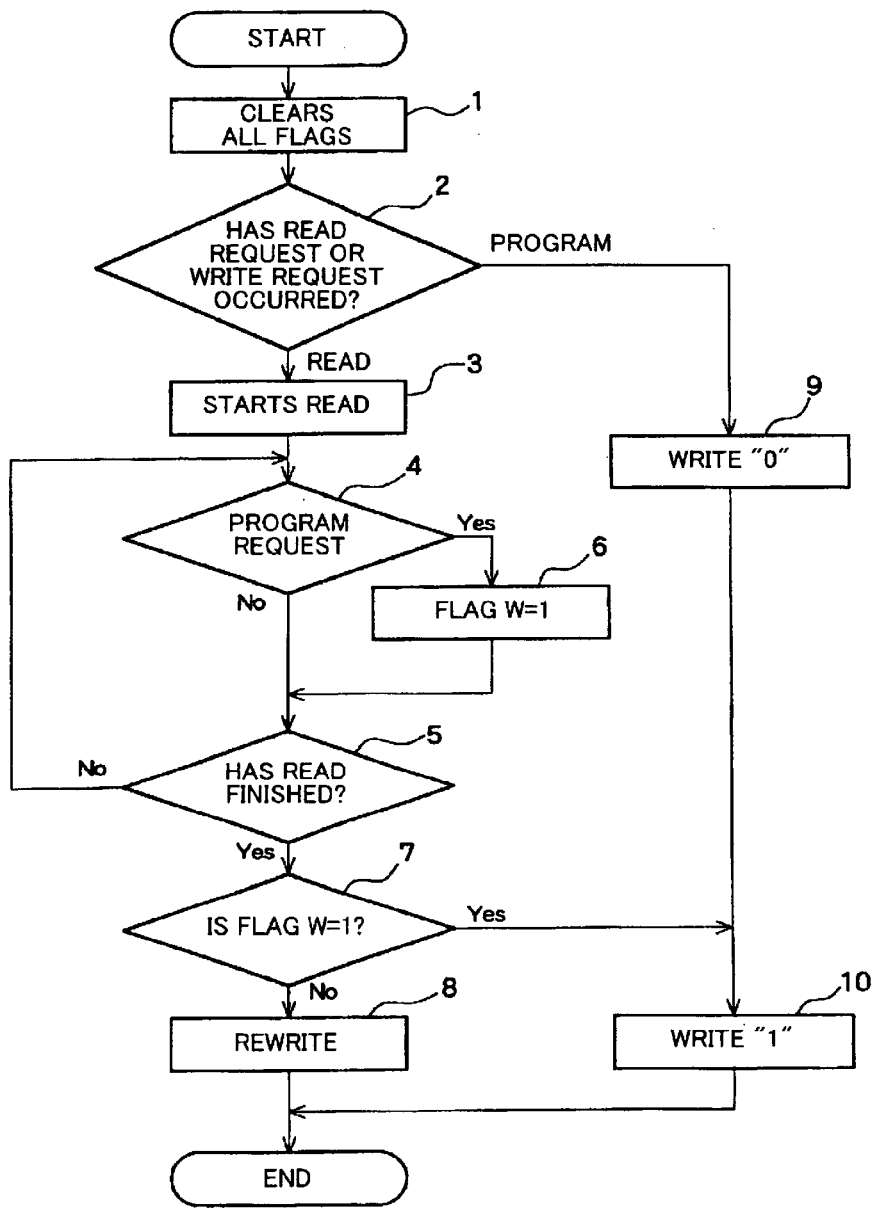
FIG. 9 is a flowchart showing a first data storage method according to an embodiment of the present invention.

The first data storage method may be performed according to a flowchart shown in FIG. 9. FIGS. 10 to 14 show embodiments which can be realized according to the flowchart shown in FIG. 9. Each embodiment is described below.

Figure 10:
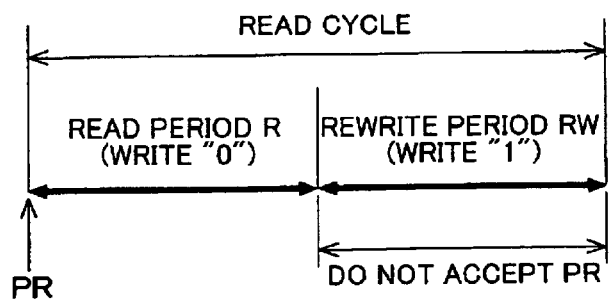
FIG. 10 shows a first example of this embodiment realized by the flowchart shown in FIG. 9.
Figure 11:
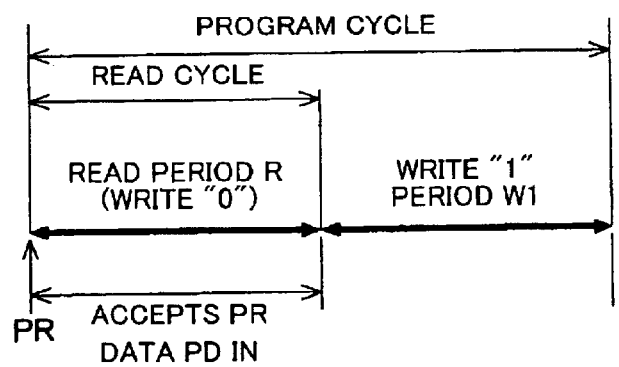
FIG. 11 shows a second example of this embodiment realized by the flowchart shown in FIG. 9.
Figure 12:
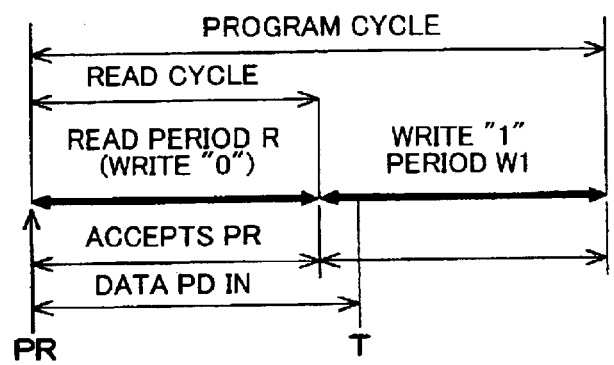
FIG. 12 shows a third example of this embodiment realized by the flowchart shown in FIG. 9.

As shown in FIG. 10, when a program request (PR) occurs in the rewrite period (RW: data "1" write period) in the latter half of the read cycle performed based on a read request (RR), the program request (PR) is not accepted. Instead of accepting the program request (PR), data "1" is rewritten into the selected memory cell which has stored data "1". As shown in FIG. 11, when the program request (PR) occurs in the read period (R: data "0" write period) in the read cycle, data "1" is written as shown in the latter period in FIG. 4 according to program data (PD). In FIG. 11, the program data (PD) may be input any time before the data "1" write period (W1) starts. As shown in FIG. 12, the period in which the program data (PD) is input may be extended to a time T at which the bitline 30 connected with the selected memory cell reaches the select voltage in the data "1" write period (W1), differing from FIG. 11. This is because the data "1" write operation substantially starts after the bitline 30 has risen to the select voltage.

Figure 13:
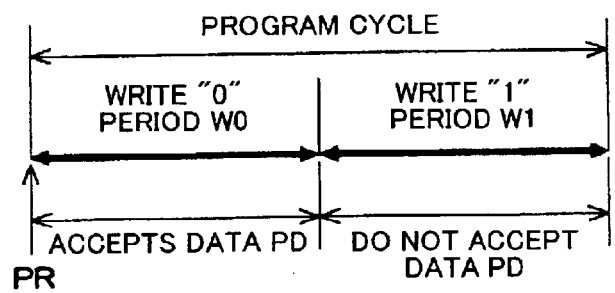
FIG. 13 shows a fourth example of this embodiment realized by the flowchart shown in FIG. 9.
Figure 14:
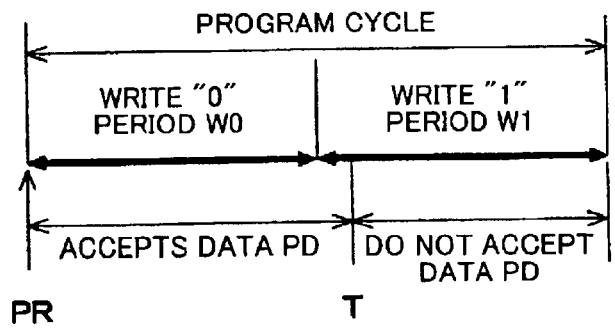
FIG. 14 shows a fifth example of this embodiment realized by the flowchart shown in FIG. 9.

The first data storage method may also be applied to the program cycle, as shown in FIG. 13 or 14. As shown in FIG. 13, when a change request for new program data (PD) occurs in a period other than the data "0" rewrite period (W0) in the program cycle performed based on the program request (PR), the change request is not accepted. In other words, when the program data (PD) is input or the change request for new program data (PD) occurs in the data "0" write period (W0) in the program cycle, the data "1" write operation can be performed according to the latest program data (PD). This is described above with reference to FIG. 5. In FIG. 5, data "0" is written into all of the selected memory cells in the data "0" write period (W0) in the program cycle. Therefore, it suffices that the program data (PD) be determined before the data "1" write period (W1) starts. In other words, data "1" can be written as shown in the latter period in FIG. 4 according to the latest program data (PD) immediately before the data "1" write period (W1) starts.

As shown in FIG. 14, the period in which the program data (PD) is input may be extended to a time T at which the bitline 30 connected with the selected memory cell reaches the select voltage in the data "1" write period (W1), differing from FIG. 13. This is because the data "1" write operation substantially starts after the bitline 30 has risen to the select voltage, as described above.

The program data (PD) may be data input to the I/O terminal 130 shown in FIG. 7, or may be data input to other data input terminal. In the case where the data output timing is close to the data input timing, data output may be forced to terminate by using the output enable signal /OE or the write enable signal /WE.

The flowchart shown in FIG. 9 is described below based on the embodiments shown in FIGS. 10 to 14. The control circuit 160 shown in FIG. 8 includes a flag storage section (not shown). First, a flag is set at "0" (step 1). If it is judged that the read request has occurred in a step 2, the read cycle starts (step 3). Whether or not the program request (PR) has been input before the read period (R) finished is judged (steps 4 and 5). If it is judged that the program request (PR) has occurred in the step 4, the flag is set at "1" (step 6).

If it is judged that the read period (R) has finished in the step 5, the operation transitions to the rewrite period (RR) (step 8) only in the case where the flag is not "1" in a step 7.

The presence or absence of occurrence of the program request (PR) is not judged in the rewrite period (RW). Therefore, when the program request (PR) occurs in the rewrite period (RW: data "1" write period) in the latter half of the read cycle performed based on the read request (RR), the program request (PR) is not accepted as shown in FIG. 10 by performing the steps 1 to 8.

If the judgment in the step 7 is YES, the program request (PR) has occurred in the read period (R) in the read cycle, as shown in FIG. 11 or 12. In this case, data "1" is written as shown in the latter period in FIG. 4 according to the program data (PD) (step 10). The program data (PD) may be accepted in the period shown in FIG. 11 or 12. This allows the program request (PR) to be accepted in the middle of the read cycle. In this case, data "0" is written into all of the selected memory cells in the first half of the read cycle, and the latter half becomes the data "1" write period (W1) in the program cycle.

If it is judged that the program request has occurred in the step 2 in FIG. 9, the data "0" write period (W0) and the data "1" write period (W1) in the program cycle are respectively set in the steps 9 and 10.

5. Second Data Storage Method

Figure 15:
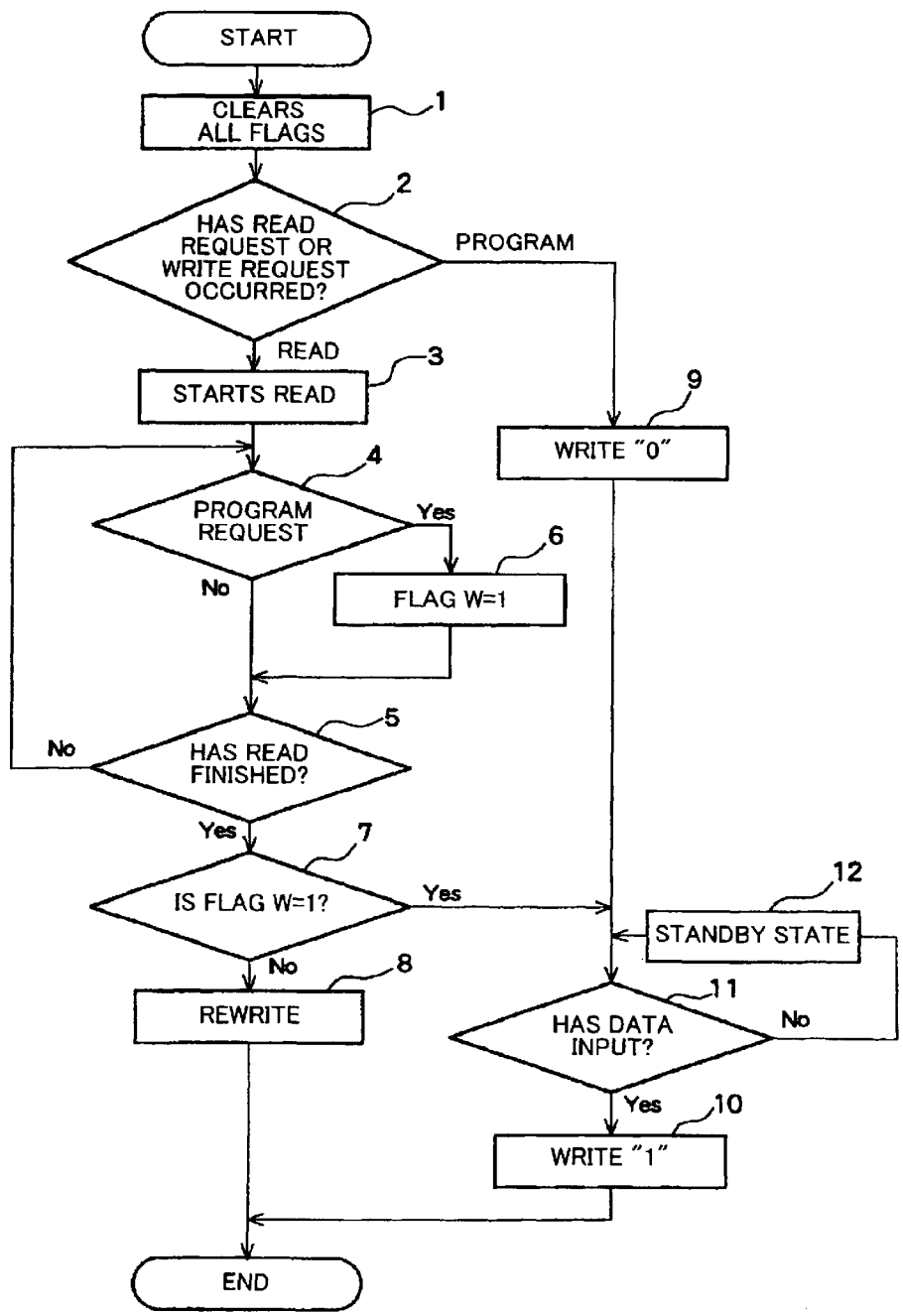
FIG. 15 is a flowchart showing a second data storage method according to an embodiment of the present invention.

The second data storage method may be realized according to a flowchart shown in FIG. 15. FIG. 15 differs from FIG. 9 in that steps 11 and 12 are added between the steps 9 and 10 in FIG. 9. In the step 11, it is judged whether or not the program data (PD) has been input before the data "1" write period (W1) in the step 10. If the judgment in the step 11 is NO, all of the memory cells are set in the standby state. In the standby state, the voltage applied to all of the memory cells is set at 0 V.

Since the flowchart shown in FIG. 15 includes all the steps shown in FIG. 9, data storage can be performed in all of the embodiments shown in FIGS. 10 to 14. However, the flowchart shown in FIG. 15 is not limited to the embodiments in which the input delay of the program data (PD) is limited as shown in FIGS. 13 and 14. The flowchart shown in FIG. 15 also enables data storage in embodiments shown in FIGS. 16 and 17.

Figure 16:
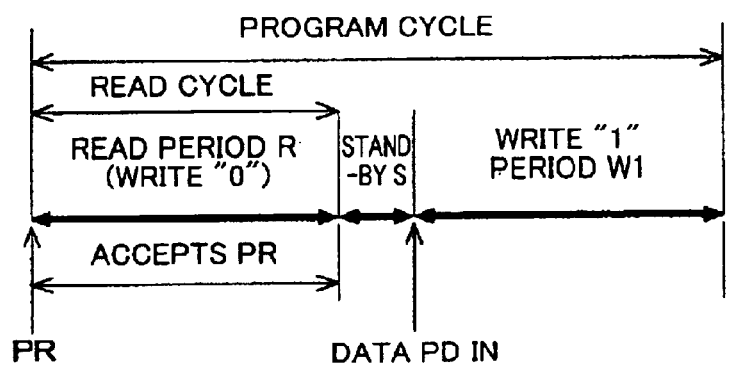
FIG. 16 shows an additional first example of this embodiment realized by the flowchart shown in FIG. 15.

FIG. 16 shows an embodiment in the case where the judgment in the step 7 in FIG. 15 is YES. This means that the program request (PR) has occurred in the read period (R) in the read cycle, as shown in FIG. 11, 12, or 16. If the judgment in the step 11 in FIG. 15 is YES, data "1" is written as shown in the latter period in FIG. 4 according to the program data (PD). The embodiment in this case is the same as the embodiment shown in FIG. 11 or 12.

If the judgment in the step 11 in FIG. 15 is NO, the step 10 cannot be performed since the program data (PD) does not exist. Therefore, the operation waits for input of the program data (PD). All of the memory cells are set in the standby state (S) in the step 12 in FIG. 15 during the wait period. In the standby state (S), the voltage applied to all of the memory cells is set at 0 V. Therefore, since a disturbance voltage is not applied to the ferroelectric capacitors 50, a decrease in data read margin or destruction of data does not occur. If the memory cells are not set in the standby state, the unselected voltage ⅓ Vs is continuously applied to the unselected memory cells, whereby the polarization of the ferroelectric capacitors 50 deteriorates and the data read margin decreases. In the worst case, data is destroyed (data "0" and "1" cannot be distinguished).

Figure 17:
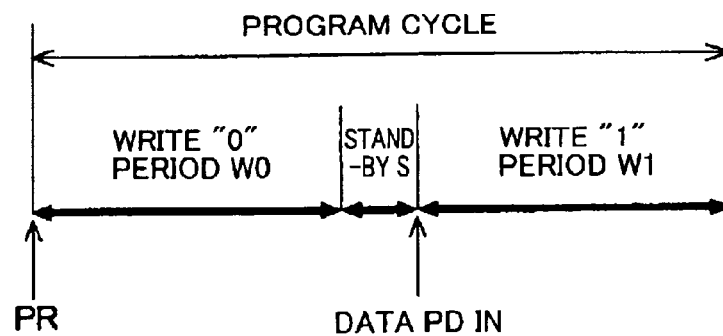
FIG. 17 shows an additional second example of this embodiment realized by the flowchart shown in FIG. 15.

The above-described operation is also performed in the case where it is judged that the program request has occurred in the step 2 in FIG. 15, and the operation transitions to the program cycle in the step 9. In this case, the standby state (S) is set between the data "0" write period (W0) and the data "1" write period (W1), as shown in FIG. 17.

6. Third Data Storage Method

Figure 18:
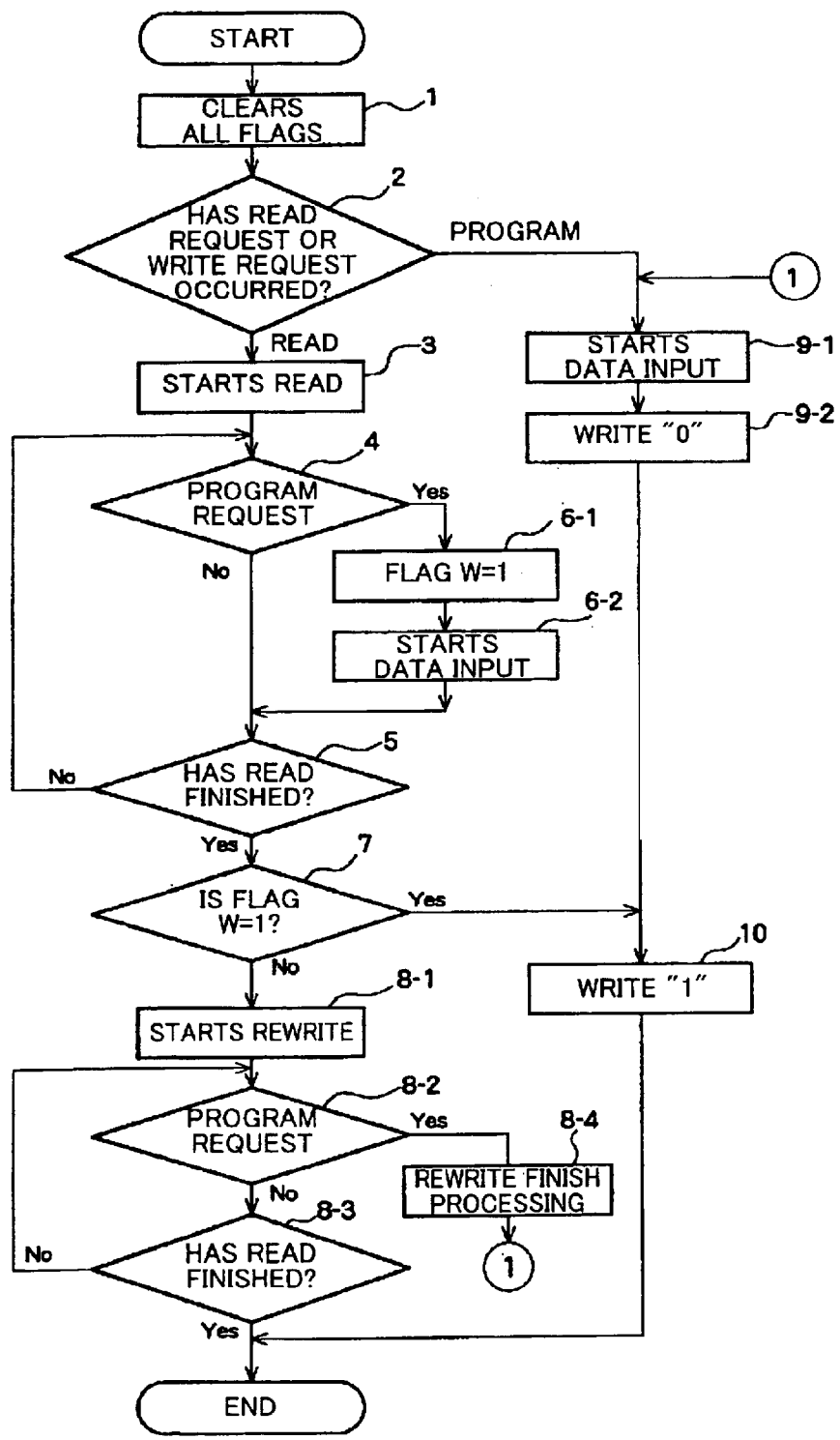
FIG. 18 is a flowchart showing a third data storage method according to an embodiment of the present invention.

The third data storage method may be performed according to a flowchart shown in FIG. 18. FIG. 18 differs from FIG. 9 in that the step 6 in FIG. 9 is divided into steps 6-1 and 6-2 in FIG. 18 and the step 9 in FIG. 9 is divided into steps 9-1 and 9-2 in FIG. 18. The steps 9-1 and 9-2 may each be replaced by the other. The step 6-1 in FIG. 18 is the same as the step 6 in FIG. 9, and the step 9-2 in FIG. 18 is the same as the step 9 in FIG. 9. The start of data input is made definite in the steps 6-2 and 9-1 in FIG. 18.

However, the above difference is not substantial. FIG. 9 may include the steps 6-2 and 9-1 in FIG. 18. Therefore, the flowchart in FIG. 18 substantially involves the flowchart in FIG. 9. In the flowchart in FIG. 18, embodiments the same as the embodiments shown in FIGS. 10 to 14 can be realized. However, in the flowchart in FIG. 18, the period in which the program request (PR) is accepted in the read cycle is not limited to the read period (R), differing from FIGS. 11 and 12. The program request (PR) can be accepted any time during the read cycle.

Figure 19:
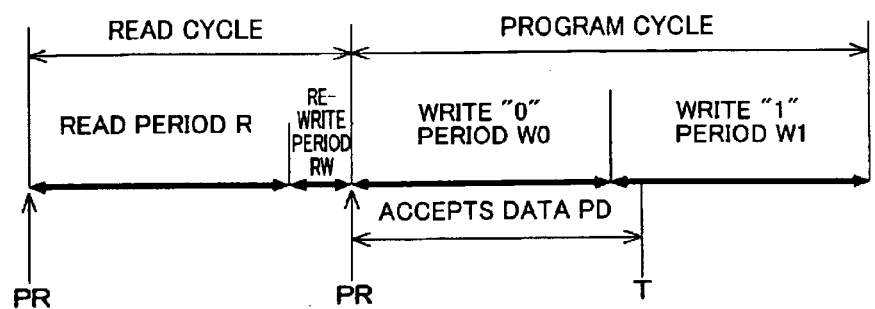
FIG. 19 shows an additional first example of this embodiment realized by the flowchart shown in FIG. 18.

FIG. 18 substantially differs from FIG. 9 in that the step 8 in FIG. 9 is replaced by steps 8-1 to 8-4 shown in FIG. 18. In the flowchart in FIG. 18, whether or not the program request has occurred is judged (step 8-2) between start of the rewrite period (RW) (step 8-1) and finish of the rewrite period (RW) (step 8-3). If the program request is accepted in the step 8-2, the rewrite period (RW) is immediately terminated (step 8-4). The program cycle is then started from the beginning (steps 9-1 to 10). This embodiment is shown in FIG. 19. In FIG. 19, the period in which the program data (PD) is input is extended to a time T at which the bitline 30 connected with the selected memory cell reaches the select voltage in the data "1" write period (W1). However, the period in which the program data (PD) is input may be limited to timing at which the data "0" write period (W0) finishes.

According to the third data storage method, the program request can be accepted any time during the read cycle.

7. Fourth Data Storage Method

Figure 20:
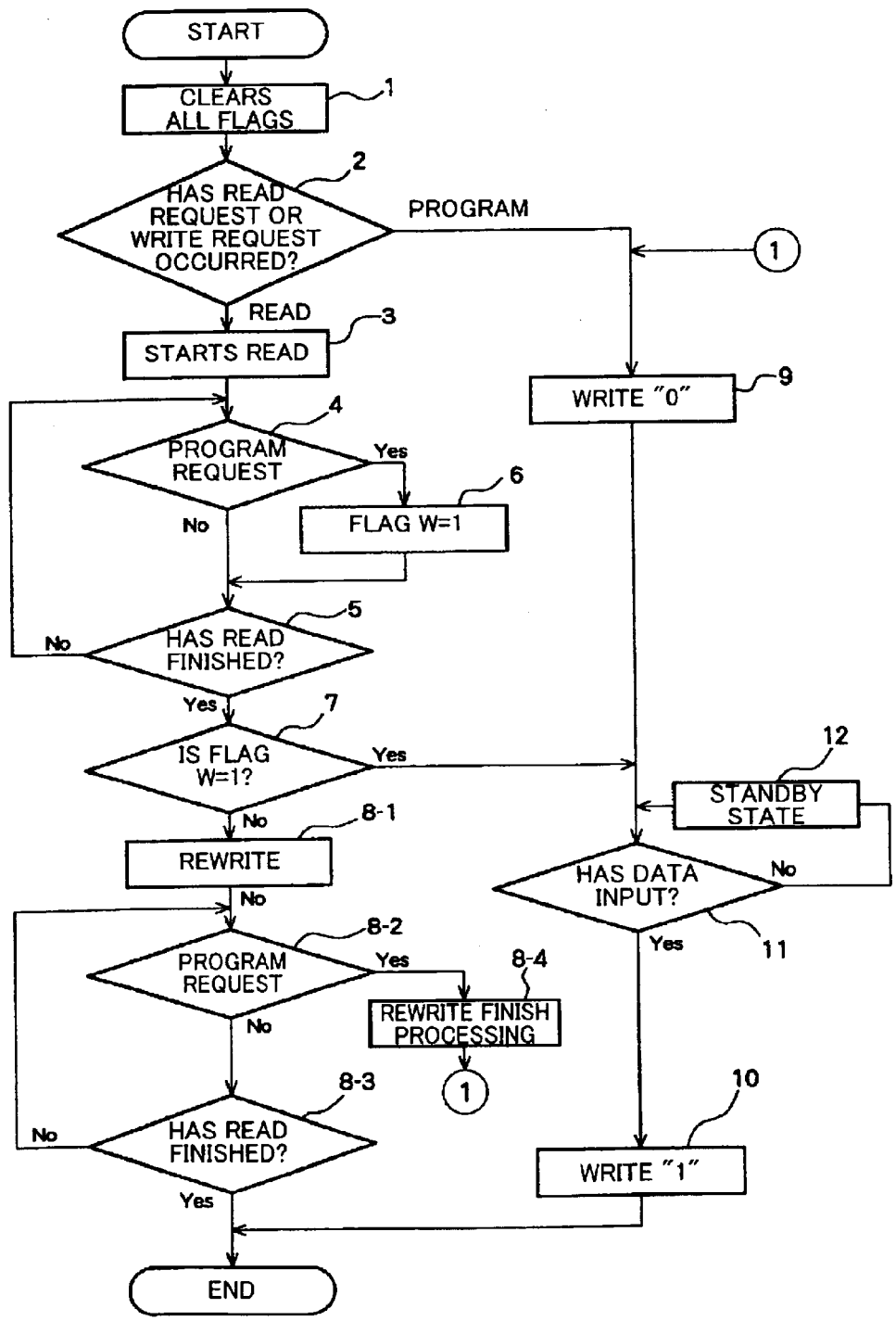
FIG. 20 is a flowchart showing a fourth data storage method according to an embodiment of the present invention.

The fourth data storage method is shown in FIG. 20, in which a part of the flowchart in FIG. 18 is changed according to FIG. 15. The flowchart in FIG. 20 includes the steps 6, 9, 11, and 12 in the same manner as in FIG. 15. FIG. 20 includes the steps 8-1 to 8-4 in the same manner as in FIG. 18.

Figure 21:
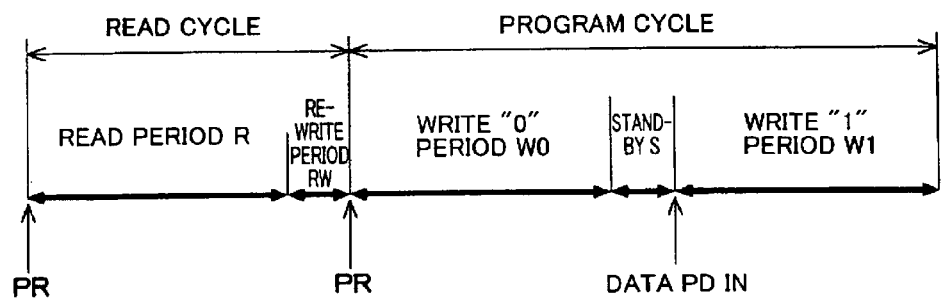
FIG. 21 shows an additional first example of this embodiment realized by the flowchart shown in FIG. 20.

The flowchart in FIG. 20 realizes the embodiment shown in FIG. 19. However, the input delay of the program data is not limited differing from FIG. 19. An embodiment shown in FIG. 21 is realized by the flowchart in FIG. 20 as described with reference to FIG. 15.

The present invention is not limited to the above-described embodiments. Various modifications and variations are possible within the spirit and scope of the present invention.

The program data may be captured at timing at which the write enable signal /WE is enabled and the program request occurs, or at timing at which the write enable signal /WE is disabled.

What is claimed is:

1. A method of storing data in a ferroelectric memory device which includes a plurality of wordlines, a plurality of bitlines which intersect the plurality of wordlines, and a plurality of memory cells, each of the memory cells being provided at an intersecting point of one of the wordlines and one of the bitlines and including a ferroelectric capacitor to which voltage between one of the wordlines and one of the bitlines that intersect each other is directly applied, the method comprising:

performing a program cycle or a read cycle for a plurality of selected memory cells selected from among the plurality of memory cells, each of the program cycle and the read cycle including a first period for writing first data into the selected memory cells and a second period for writing second data into the selected memory cells, and the second period being set after the first period; and writing the second data into the selected memory cells according to program data designated by the program request, when a program request occurs in the first period in the read cycle.

2. The method of storing data in a ferroelectric memory device as defined in claim 1, wherein, when the program request occurs in the second period in the read cycle, the second data is rewritten into a memory cell that stores the second data among the selected memory cells without accepting the program request.

3. The method of storing data in a ferroelectric memory device as defined in claim 1, wherein the program data is input before the second period starts.

4. The method of storing data in a ferroelectric memory device as defined in claim 1, wherein the program data is input before the wordlines or the bitlines connected with the selected memory cells reach a select voltage in the second period.

5. The method of storing data in a ferroelectric memory device as defined in claim 1, wherein the second period starts after the program data has been input.

6. The method of storing data in a ferroelectric memory device as defined in claim 5, wherein the memory cells are set in a standby state, in which the voltage is not applied to the memory cells, during a period until the program data is input after the first period has finished.

7. The method of storing data in a ferroelectric memory device as defined in claim 1, wherein, when the program request occurs in the second period in the read cycle, the read cycle is terminated before an entire part of the read cycle has completed and the program cycle starts according to the program request.

8. A method of storing data in a ferroelectric memory device which includes a plurality of wordlines, a plurality of bitlines which intersect the plurality of wordlines, and a plurality of memory cells, each of the memory cells being provided at an intersecting point of one of the wordlines and one of the bitlines and including a ferroelectric capacitor to which voltage between one of the wordlines and one of the bitlines that intersect each other is directly applied, the method comprising:

performing a program cycle or a read cycle for a plurality of selected memory cells selected from among the plurality of memory cells, each of the program cycle and the read cycle including a first period for writing first data into the selected memory cells and a second period for writing second data into the selected memory cells, and the second period being set after the first period; and writing the first data into all of the memory cells irrespective of presence or absence of program data in the first period in the program cycle, and writing the second data into a memory cell designated by the program data from among the plurality of selected memory cells when the program data is input in the first period in the program cycle.

9. The method of storing data in a ferroelectric memory device as defined in claim 8, wherein, when a change request for new program data occurs in a period other than the first period, the change request is not accepted.

10. The method of storing data in a ferroelectric memory device as defined in claim 8, wherein, when the program data is input before the wordlines or the bitlines connected with the selected memory cells reach a select voltage in the second period, the write operation of the second data is performed according to the program data.

11. The method of storing data in a ferroelectric memory device as defined in claim 8, wherein the second period in the program cycle starts after the program data has been input.

12. The method of storing data in a ferroelectric memory device as defined in claim 11, wherein the memory cells are set in a standby state, in which the voltage is not applied to the memory cells, during a period until the program data is input after the first period has finished.

* * * * *